(12) United States Patent
Feichtinger et al.

(10) Patent No.: US 9,693,482 B2
(45) Date of Patent: Jun. 27, 2017

(54) SEMICONDUCTOR DEVICE

(71) Applicant: EPCOS AG, Munich (DE)

(72) Inventors: Thomas Feichtinger, Graz (AT); Franz Rinner, Deutschlandsberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/646,444

(22) PCT Filed: Oct. 29, 2013

(86) PCT No.: PCT/EP2013/072613
§ 371 (c)(1),
(2) Date: May 21, 2015

(87) PCT Pub. No.: WO2014/082809
PCT Pub. Date: Jun. 5, 2014

(65) Prior Publication Data
US 2015/0271948 A1 Sep. 24, 2015

(30) Foreign Application Priority Data

Nov. 27, 2012 (DE) .......................... 10 2012 111 458

(51) Int. Cl.
*H05K 7/20* (2006.01)
*H01L 23/34* (2006.01)
(Continued)

(52) U.S. Cl.
CPC ............. *H05K 7/205* (2013.01); *H01L 23/34* (2013.01); *H01L 23/3675* (2013.01); *H01L 23/3677* (2013.01); *H01L 23/3735* (2013.01); *H01L 23/3736* (2013.01); *H01L 23/49827* (2013.01); *H01L 23/49838* (2013.01); *H01L 24/02* (2013.01); *H01L 25/16* (2013.01); *H01L 25/167* (2013.01); *H01L 33/64* (2013.01);
(Continued)

(58) Field of Classification Search
CPC ........ H05K 7/209; H01L 25/167; H01L 33/64
See application file for complete search history.

(56) References Cited

U.S. PATENT DOCUMENTS 4,981,633 A * 1/1991 Alles .................... C04B 35/4682
264/616
7,307,032 B2 * 12/2007 Miyauchi ................ C03C 3/091
257/E23.009

(Continued)

FOREIGN PATENT DOCUMENTS

CN 1816918 A 8/2006
DE 102006000935 A1 7/2007
(Continued)

OTHER PUBLICATIONS

"TALEX—LED modules, converters and systems; General Illumination; TALEX module SPOT P340-3," Tridonic, Data Sheet LED078-2, www.tridonic.com, May 2012, 8 pages.

*Primary Examiner* — Robert J Hoffberg
(74) *Attorney, Agent, or Firm* — Slater Matsil, LLP

(57) ABSTRACT

A semiconductor device includes a semiconductor component on a carrier body that includes a ceramic body and a thermistor sensor structure directly connected to the ceramic body. The thermistor sensor structure is integrated into the carrier body and includes a heat sink, on which the carrier body is mounted.

19 Claims, 3 Drawing Sheets

(51) Int. Cl.
*H01L 23/498* (2006.01)
*H01L 33/64* (2010.01)
*H01L 25/16* (2006.01)
*H01L 23/367* (2006.01)
*H01L 23/373* (2006.01)
*H01L 23/00* (2006.01)

(52) U.S. Cl.
CPC .......... *H01L 33/641* (2013.01); *H01L 33/642* (2013.01); *H01L 24/32* (2013.01); *H01L 2224/023* (2013.01); *H01L 2224/04042* (2013.01); *H01L 2224/32225* (2013.01); *H01L 2224/48091* (2013.01); *H01L 2224/48464* (2013.01); *H01L 2224/83801* (2013.01); *H01L 2924/12041* (2013.01); *H01L 2924/1304* (2013.01); *H01L 2924/1305* (2013.01); *H01L 2924/13055* (2013.01); *H01L 2924/13091* (2013.01); *H01L 2924/14* (2013.01); *H01L 2924/19107* (2013.01)

(56) References Cited

U.S. PATENT DOCUMENTS

| | | | | |
|---|---|---|---|---|
| 7,537,963 B2 * | 5/2009 | Bernitz | .................... | G01K 7/16 438/107 |
| 7,763,896 B2 * | 7/2010 | Wang | .................... | H01L 25/167 257/82 |
| 8,104,922 B2 * | 1/2012 | Harbers | .................... | F21K 9/54 362/230 |
| 8,169,046 B2 * | 5/2012 | Chen | .................... | G01K 7/183 257/467 |
| 8,247,829 B2 * | 8/2012 | Kim | .................... | H01L 33/486 257/98 |
| 8,310,037 B2 * | 11/2012 | Liu | .................... | H01L 25/167 257/686 |
| 8,378,379 B2 * | 2/2013 | Tanida | .................... | H01L 33/486 257/99 |
| 8,488,316 B2 * | 7/2013 | Zeng | .................... | H02M 7/003 257/666 |
| 8,692,349 B2 * | 4/2014 | Kim | .................... | H01L 23/34 257/414 |
| 8,878,222 B2 * | 11/2014 | Chen | .................... | G01K 7/183 257/459 |
| 9,029,180 B2 * | 5/2015 | Britton | .................... | G01K 7/226 438/171 |
| 9,070,850 B2 * | 6/2015 | Keller | .................... | H01L 33/62 |
| 9,177,703 B2 * | 11/2015 | Feichtinger | .............. | H01C 7/10 |
| 9,196,402 B2 * | 11/2015 | Feichtinger | .............. | H01C 1/084 |
| 9,532,454 B2 * | 12/2016 | Block | .................... | H01C 1/14 |
| 9,548,286 B2 * | 1/2017 | Sills | .................... | H01L 25/0753 |
| 2002/0075129 A1 | 6/2002 | Mizoguchi et al. | | |
| 2004/0222210 A1 * | 11/2004 | Lin | .................... | H01L 21/67103 219/444.1 |
| 2006/0138443 A1 | 6/2006 | Fan et al. | | |
| 2006/0180821 A1 | 8/2006 | Fan et al. | | |
| 2006/0267614 A1 * | 11/2006 | Lee | .................... | H05B 3/265 324/750.11 |
| 2009/0035560 A1 | 2/2009 | Block et al. | | |
| 2010/0078668 A1 | 4/2010 | Kim | | |
| 2011/0188161 A1 * | 8/2011 | Feichtinger | .............. | H01C 7/10 361/52 |
| 2011/0261536 A1 | 10/2011 | Feichtinger et al. | | |
| 2012/0014059 A1 * | 1/2012 | Zeng | .................... | H02M 7/003 361/690 |
| 2012/0032182 A1 | 2/2012 | Sills et al. | | |
| 2014/0247859 A1 * | 9/2014 | Kim | .................... | G01K 3/06 374/178 |

FOREIGN PATENT DOCUMENTS

| | | |
|---|---|---|
| DE | 102008024480 A1 | 12/2009 |
| DE | 202011108919 U1 | 1/2012 |
| EP | 2056363 A2 | 5/2009 |
| JP | H08335747 A | 12/1996 |
| JP | 2002048655 A | 2/2002 |
| JP | 2004186309 A | 7/2004 |
| JP | 2006286786 A | 10/2006 |
| JP | 2008028029 A | 2/2008 |
| JP | 2008172113 A | 7/2008 |
| JP | 2012084900 A | 4/2012 |
| JP | 2012204783 A | 10/2012 |
| TW | 200950027 A | 12/2009 |
| WO | 2009141439 A1 | 11/2009 |
| ZA | WO 2012035494 A1 * | 3/2012 ............. G01K 7/226 |

* cited by examiner

SEMICONDUCTOR DEVICE

This patent application is a national phase filing under section 371 of PCT/EP2013/072613, filed Oct. 29, 2013, which claims the priority of German patent application 10 2012 111 458.7, filed Nov. 27, 2012, each of which is incorporated herein by reference in its entirety.

TECHNICAL FIELD

A semiconductor device comprising a semiconductor component is specified.

BACKGROUND

Power semiconductors, starting from a critical temperature of the semiconductor junction, which can also be referred to as $T_J$ ("junction temperature"), exhibit a significant reduction ("derating") of lifetime and performance. Typical power semiconductors include, for example, light-emitting diodes (LEDs), in particular so-called high-power LEDs, integrated circuits (IC) such as, for example, high-power graphics chips, power amplifiers and power transistors such as, for example, power MOSFETs and IGBTs. A derating begins typically at a temperature $T_J$ of approximately 105° C., for example, in the case of high-power LEDs, and typically at a temperature $T_J$ of approximately 175° C. in the case of IGBTs. In the case of LEDs, in particular, there is the risk not only of reduction of the lifetime of the power semiconductor per se, but also of degradation of phosphor-silicone layers used, for example, as a result of which the light spectrum of an LED could change in an undesirable manner.

In conventional system solutions, the temperature of the power semiconductor during operation is often not known accurately enough, and so the power has to be limited to a safety value that is usually 85 to 90% of the maximum usable power. A further increase in power without the risk of a derating requires a thermally optimized carrier and temperature monitoring.

Efficient temperature management is becoming more and more important in the case of LEDs, for example, in the dimensioning of the light power, in particular the maximum achievable light power (in lumens/watt). On account of the limited modeling accuracies of the carrier system, the temperature of LEDs has to be regulated downward to 85 to 90° C., such that the LEDs cannot be operated with maximum power at the—with regard to derating—maximum possible temperature of typically 105° C. This results in performance losses of approximately 5% per 10° C. lower temperature.

In the case of solutions in accordance with the prior art, by way of example, power semiconductors and a temperature sensor are applied alongside one another on a ceramic carrier or silicon carrier, wherein one or a plurality of power semiconductors are placed on a planar surface of a carrier on which a temperature sensor element is also arranged. The power semiconductors here can in each case also comprise individual carriers ("level-1 carriers"), with which they are applied to the common carrier ("level-2 carrier"). Mounting on a heat sink is effected in turn by way of the common carrier. As a result, at a multiplicity of interfaces such as soldering connections, for instance, thermal resistances and junction conductances arise, and they can be described usually relatively inaccurately. The temperature measured by the temperature sensor alongside the one or the plurality of power semiconductors is determined by the thermal resistances and the junction conductances between the individual component parts and by the heat conduction in the individual component parts, such as, for instance, in the common carrier and in the heat sink, and thus to a certain degree constitutes only an indirect measurement. As a result of the additional arrangement of a temperature sensor on a common carrier with one or a plurality of power semiconductors, an increased space requirement and hence a larger structural size are additionally accepted as well.

SUMMARY

In order to achieve the best possible heat transfer from a power semiconductor to a heat sink, attempts are made, for example, to reduce as far as possible the number of interposed component parts and materials, for example, in the form of carrier bodies, or even to mount a power semiconductor directly onto a heat sink.

Specific embodiments specify a semiconductor device which enables a measurement of a temperature of a semiconductor component that generates heat during operation.

In accordance with at least one embodiment, a semiconductor device comprises a semiconductor component. The semiconductor component can be a power semiconductor component, for example. The power semiconductor component can be for instance a semiconductor component which, without sufficient cooling during operation as intended, can reach a temperature that could damage the semiconductor component. By way of example, the semiconductor component can be selected from a light-emitting diode, an integrated circuit such as, for instance, a graphics chip, an amplifier chip and a transistor. In particular, the semiconductor component can be, for example, a high-power LED, a high-power graphics chip, a power amplifier, a power MOSFET or an IGBT.

Furthermore, the semiconductor device comprises a carrier body, on which the semiconductor component is mounted. The carrier body is in particular a carrier body which is produced separately from the semiconductor component and onto which the completed semiconductor component is applied or mounted. The carrier body comprises a temperature sensor integrated into the carrier body. In particular, the carrier body can comprise a thermistor sensor structure which is integrated into the carrier body and which is provided and designed for enabling a temperature measurement by way of a resistance change. The thermistor sensor structure can particularly preferably be formed by an NTC thermistor material and be embodied, for example, as a mono- or multilayer thermistor component which allows a resistance measurement by means of suitable contact-connections. In particular, the thermistor sensor structure can comprise a suitable NTC ceramic material. As an alternative thereto, the thermistor sensor structure can also comprise, for example, a PTC material, for example, a PTC ceramic. Materials and basic constructions of ceramic NTC and PTC thermistors are known to the person skilled in the art and are therefore not explained in any further detail here.

Furthermore, the carrier body comprises a ceramic body directly connected to the thermistor sensor structure integrated into the carrier body. In this case, the ceramic body can be embodied in particular with regard to a suitable carrier property and stability and also the highest possible thermal conductivity. By way of example, the ceramic body can comprise aluminum oxide and/or aluminum nitride. The ceramic body can be embodied, for example, as carrier material for the thermistor sensor structure integrated into the carrier body. In other words, the thermistor sensor structure can be applied on the ceramic body. The ceramic body and the thermistor sensor structure can be manufactured monolithically in a common process, for example.

In accordance with at least one embodiment, the ceramic body has a greater electrical resistance than the thermistor sensor structure. In particular, the ceramic body can have, for example, an electrical resistance of more than 50 000 Ω·cm. The integrated thermistor sensor structure can have an electrical resistance of less than 5000 Ω·cm, preferably of less than 2000 Ω·cm, and particularly preferably of less than 1000 Ω·cm. Unless indicated otherwise, here and hereinafter "electrical resistance" denotes the electrical resistivity. By way of example, the ceramic body can also be electrically insulating in comparison with the thermistor sensor structure.

Furthermore, the semiconductor device comprises a heat sink on which the carrier body is mounted. The heat sink can be embodied in particular as a metallic heat sink. In this case, a metallic heat sink denotes a heat sink which substantially consists of a metal body, to which, by way of example, electrically insulating layers can be applied regionally or over a large area for the purpose of electrical insulation and/or electrical contact regions, conductor tracks and/or connections can be applied for the purpose of electrical connection of the semiconductor device and/or of the semiconductor component.

In particular, the semiconductor device described here is embodied in such a way that during operation a power-related temperature difference between the semiconductor component and the thermistor sensor structure is less than 3 K/W. Such a small temperature difference between the semiconductor component and the thermistor sensor structure can be achieved in particular by means of one or more of the following configurations for the ceramic body.

In the case of the semiconductor device described here, the thermistor sensor structure is arranged in particular in a heat dissipating path between the semiconductor component and the heat sink, that is to say along a temperature gradient that forms in the semiconductor device during operation. In this case, the heat dissipating path can in particular also correspond to the arrangement direction of the carrier body and of the semiconductor component on the heat sink. In other words, by virtue of the specific arrangement of the thermistor sensor structure as described here, the heat which is generated in the semiconductor component during operation and which is dissipated through the carrier body in the direction of the heat sink is necessarily conducted through the thermistor sensor structure. As a result, it is possible to achieve a more direct temperature measurement of the temperature of the semiconductor component than is the case for conventional power semiconductor systems in which a temperature sensor is arranged on a common carrier alongside a power semiconductor. Furthermore, a small structural size or height can be achieved as a result of the integration of the thermistor sensor structure into the carrier body. Especially in mobile applications such as, for example, an integrated LED camera flash in a smartphone or a digital camera, the semiconductor device described here, in comparison with a conventional design comprising an LED and a discrete temperature sensor, can require less space by virtue of a smaller structural height and/or a smaller device area.

In accordance with a further embodiment, the thermistor sensor structure, as viewed from the heat sink, is arranged above the ceramic body, that is to say between the ceramic body and the semiconductor component. What can be achieved as a result is that the thermistor sensor structure is arranged in greater proximity to the heat-generating semiconductor component, as a result of which the temperature of the semiconductor component can be measurable as directly as possible.

Furthermore, it can also be possible for the thermistor sensor structure, as viewed from the heat sink, to be arranged below the ceramic body, that is to say on that side of the ceramic body which faces away from the semiconductor component. What can be achieved as a result, for example, is that the semiconductor component, as viewed from the heat sink, can be electrically contacted on a top side by means of a contact structure of the carrier body, while the thermistor sensor structure can be electrically contacted on an underside of the carrier body separately from the semiconductor component.

Furthermore, it is also possible for the carrier body to comprise, for example, a plurality of thermistor sensor structures, for example—as viewed from the heat sink—on the top side and also on the underside of the ceramic body.

In order to enable the best possible heat dissipation, the carrier body can, for example, additionally also comprise a metal layer or metal film which can be arranged, for example, on a side of the ceramic body facing away from the thermistor sensor structure.

Furthermore, it is also possible for the carrier body to comprise thermal vias which project through the ceramic body and which are formed, for example, by metal-filled openings in the ceramic body. The thermal vias can be in thermal contact in particular with the thermistor sensor structure. By means of the thermal vias, effective heat dissipation can be achieved through the ceramic body.

In accordance with a further embodiment, the carrier body is mounted directly on the heat sink. For this purpose, the heat sink can have a contact pad, for example, on which the carrier body is adhesively bonded or soldered. Furthermore, the carrier body can also be mounted on the heat sink directly by means of a suitable connecting material, for example, a solder or an adhesive. The highest possible heat dissipation from the semiconductor component can be achieved by as direct thermal contact as possible between the carrier body and the heat sink.

Furthermore, it can also be possible that a plurality of carrier bodies each having a semiconductor component mounted thereon are arranged on the heat sink. For this purpose, the heat sink can have a corresponding plurality of contact pads. For the purpose of electrical insulation of the carrier bodies with respect to one another, the heat sink can also comprise an insulator layer between a metal body and the carrier bodies. Unless explicitly indicated otherwise, "insulating", "insulation" and "insulator" denote an electrically insulating property.

In accordance with a further embodiment, the carrier body has a contact structure on the side which faces away from the heat sink and on which the semiconductor component is also applied, by means of which contact structure the semiconductor component is mounted on the carrier body. The contact structure can simultaneously serve for making electrical contact with the semiconductor component. Furthermore, the carrier body can have a metal structure for redistribution wiring and for electrically contacting the semiconductor component externally, that is to say, for example, to an external current and/or voltage source, which is electrically conductively connected to the contact structure for mounting the semiconductor component. By way of the metal structure, for example, the semiconductor component can be electrically connected by means of wire connections, for example, by means of bonding wires. Furthermore, the heat sink can also have metal structures in the form of conductor tracks and/or electrical connection locations, which are connected to the metal structure of the carrier body, for example, by means of wire contact-connections.

In accordance with a further embodiment, the carrier body comprises an insulator layer between the thermistor sensor structure and semiconductor component. Said insulator layer can be embodied, for example, as a carrier layer for a contact structure and/or a metal structure for redistribution wiring and can in particular also electrically insulate the semiconductor component from the thermistor sensor structure. For the case where the semiconductor component is embodied as a light-emitting diode, the insulator layer can particularly preferably also be embodied as reflective, for example, white. By way of example, the insulator layer can be formed by a ceramic material, for instance aluminum oxide, titanium oxide or silicon dioxide, or a plastic material.

In accordance with a further embodiment, a discrete protective component is additionally arranged on the heat sink. In this case, "discrete" means that the protective component is not integrated into the carrier body, but rather is mounted on the heat sink and electrically connected there separately from the carrier body and the semiconductor component arranged thereon. The discrete protective component can be an ESD protective component, for example.

BRIEF DESCRIPTION OF THE DRAWINGS

Further advantages, advantageous embodiments and developments will become apparent from the exemplary embodiments described below in association with the figures.

In the figures.

In the exemplary embodiments and figures, elements that are identical, of identical type or act identically may be provided in each case with the same reference signs. The illustrated elements and their size relationships among one another should not be regarded as true to scale; rather, individual elements such as, for example, layers, component parts, components and regions may be illustrated with an exaggerated size in order to enable better illustration and/or in order to afford a better understanding.

DETAILED DESCRIPTION OF ILLUSTRATIVE EMBODIMENTS

Figure 1:
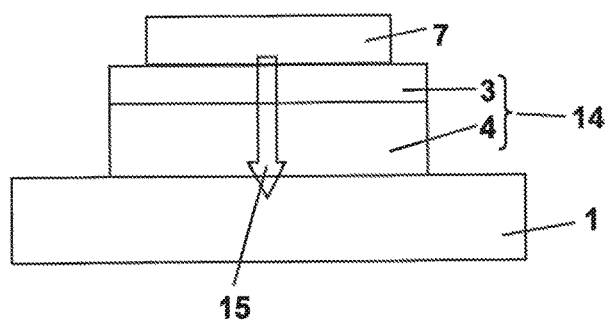
FIG. 1 shows a schematic illustration of a semiconductor device in accordance with one exemplary embodiment.

FIG. 1 shows one exemplary embodiment of a semiconductor device comprising one above another on a heat sink 1 a carrier body 14 and a semiconductor component 7 on the latter. The semiconductor component 7 can be in particular a power semiconductor component, for example, selected from a light-emitting diode, a graphics chip, an amplifier chip and a transistor. By way of example, the semiconductor component 7 can be a so-called high-power LED or a power transistor such as, for example, a power MOSFET or an IGBT.

The carrier body 14 comprises a ceramic body 4 and a thermistor sensor structure 3 as temperature sensor, said thermistor sensor structure being integrated into the carrier body 14. The thermistor sensor structure 3 is directly connected to the ceramic body 4 and is arranged on the ceramic body as viewed from the heat sink 1. The ceramic body 4 and the thermistor sensor structure 3 can, for example, be produced jointly and form a monolithic ceramic part.

During the operation of the semiconductor device, the semiconductor component 7 generates heat which generates a temperature gradient between the semiconductor component 7 and the heat sink 1 and which is carried away through the carrier body 14 to the heat sink 1. The thermistor sensor structure 3 of the carrier body 14 is thus arranged in a heat dissipating path corresponding to the temperature gradient, said heat dissipating path being indicated by the arrow 15, between the semiconductor component 7 and the heat sink 1. As a result, the semiconductor device firstly has a smaller structural size by virtue of compact dimensions since a separate temperature sensor element to be arranged alongside the carrier body and/or the semiconductor component 7 is not necessary for the purpose of temperature measurement. Furthermore, by virtue of the thermistor sensor structure 3 integrated into the carrier body 14, a temperature sensor can be arranged in direct proximity to the semiconductor component 7, as a result of which a direct measurement of the temperature of the semiconductor component is possible.

As a result thereof, and also as a result of the features described below in association with the following figures, it is possible, in the case of the semiconductor device described here, for the semiconductor device to have a temperature difference between the semiconductor component 7 and the thermistor sensor structure 3 of less than 3 K/W during operation.

The ceramic body 4 of the carrier body 14 has a greater electrical resistance than the thermistor sensor structure 3. In particular, the ceramic body can have, for example, an electrical resistance of more than 50 000 Ω·cm, while the thermistor sensor structure 3 integrated into the carrier body 14 has an electrical resistance of less than 5000 Ω·cm, preferably of less than 2000 Ω·cm, and particularly preferably of less than 1000 Ω·cm.

The thermistor sensor structure 3 is embodied in particular as an NTC thermistor, as it is called, which reacts to an increase in temperature by reducing the electrical resistance. The thermistor sensor structure is embodied in particular on the basis of a ceramic NTC thermistor material and can be embodied in a mono- or multilayer fashion with suitable electrical contacts in order to be able to measure the electrical resistance of the thermistor sensor structure externally.

The ceramic body 4 serves firstly for the mechanical stability of the carrier body 14, and secondly also for the highest possible heat dissipation from the semiconductor component 7 to the heat sink 1. For this purpose, the ceramic body 4 preferably comprises a ceramic material having a high thermal conductivity, for example, aluminum oxide or aluminum nitride.

The heat sink 1 is preferably embodied as a metallic heat sink here and in the following exemplary embodiments. That means that the heat sink 1, with regard to its thermal properties, substantially consists of a metal body, which can, for example, also have a suitable surface structure such as ribs or lamellae, for example. Furthermore, the heat sink 1, insofar as necessary, can comprise one or a plurality of insulator layers and/or electrical and/or mechanical contact regions.

Electrical contact structures and electrical and/or mechanical connecting layers are not shown in the exemplary embodiment in FIG. 1, for the sake of clarity, and are described in greater detail in association with the following figures.

On the basis of the exemplary embodiment of the semiconductor device as shown in FIG. 1, simulations were carried out in which temperature distributions and temperature differences in the region of the semiconductor component 7, of the carrier body 14 and of the heat sink 1 were simulated proceeding from known designs of LED modules. As a result, it was found that the integrated thermistor sensor structure 3 has a temperature difference of, for example, less than 2 K/W with respect to the semiconductor component 7 during operation, while a reference temperature sensor at the customary position in the prior art alongside the semiconductor component 7 had a temperature difference of more than 10 K/W. It is thus evident that as a result of the herein-described arrangement of the thermistor sensor structure integrated into the carrier body 14 along the heat dissipating path from the semiconductor component 7 to the heat sink 1, a significantly more accurate measurement of the temperature of the semiconductor component is possible.

The exemplary embodiments shown in following figures constitute modifications and further developments of the exemplary embodiment described in association with FIG. 1. Therefore, the following description is substantially restricted to the differences and modifications with respect to the exemplary embodiment in FIG. 1.

Figure 2:
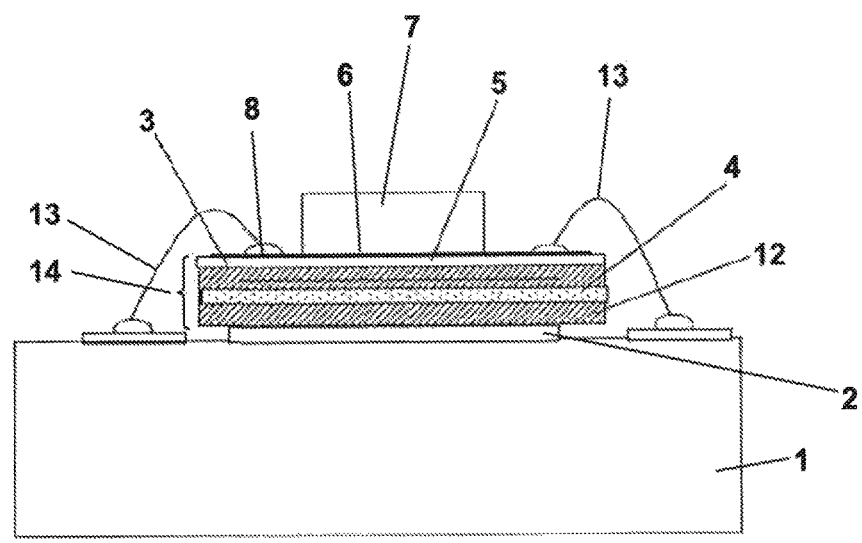
FIG. 2 shows a schematic illustration of a semiconductor component in accordance with a further exemplary embodiment.

FIG. 2 shows one exemplary embodiment of a semiconductor device, in which, as already in the exemplary embodiment in FIG. 1, as viewed from the heat sink 1, the thermistor sensor structure 3 integrated into the carrier body 14 is arranged on the ceramic body 4. Consequently, the thermistor sensor structure 3 is situated between the semiconductor component 7 and the ceramic body 4 of the carrier body 14. In order to enable the highest possible heat dissipation toward the heat sink 1 the carrier body 14 furthermore comprises a metal film 12, in particular a copper film in the exemplary embodiment shown, on that side of the ceramic body 4 which faces away from the thermistor sensor structure 3. The carrier body 14 is mounted on a contact pad 2 of the heat sink 1, for example, by soldering or by adhesive bonding.

For the electrical insulation of the thermistor sensor structure 3 with respect to the metal film 12, the ceramic body 4 is formed in particular from a material having a high electrical resistance and preferably has a breakdown voltage of more than 3 kV.

For the purpose of making electrical contact with the semiconductor component 7, the carrier body 14 has a contact structure 6, by way of which the semiconductor component 7 is mounted onto the carrier body 14. By way of example, the semiconductor component 7 can be soldered on the contact structure 6. Furthermore, it can also be possible for an electrical contact with a contact structure of the carrier body to be produced by means of a wire connection, for example, a bonding wire. For the purpose of electrical connection of the contact structure 6, the carrier body 14 furthermore has a metal structure 8 for redistribution wiring, which as a result in particular also serves for electrical connection of the semiconductor component 7 externally. In the exemplary embodiment shown, the semiconductor device comprises for this purpose wire connections 13 in the form of bonding wires which produce an electrical contact with suitable contact pads on the heat sink 1. These can be electrically insulated from one another, for example, by means of an insulator layer on the heat sink 1 and have further connection possibilities for connection to an external current and/or voltage source. The metal structure 8 can furthermore also be designed for making electrical contact with the thermistor sensor structure 3.

In order to avoid an electrical contact between the semiconductor component 7 and the thermistor sensor structure 3, the carrier body 14 furthermore comprises an insulator layer 5 between the semiconductor component 7 and the thermistor sensor structure 3, which insulator layer can comprise or be composed of, for example, an insulating ceramic material such as, for instance, titanium oxide, aluminum oxide or silicon oxide. If the semiconductor component 7 is embodied as a light-emitting diode, for example, the insulator layer 5 can preferably be embodied as reflective and in this regard white, for example. As an alternative to a ceramic material, a suitable plastic material can also be used, for example.

An encapsulation can be arranged over the semiconductor component 7 and in particular, for example, also over the carrier body 14, and can serve for protecting the semiconductor component 7 and the carrier body 14. By way of example, the encapsulation can be formed by a plastic potting. For the case where the semiconductor component 7 is embodied as a light-emitting diode, the encapsulation can also be embodied as an optical potting, for example, comprising or composed of silicone, and can be arranged, for example, in the form of a lens above the semiconductor component 7. Furthermore, the encapsulation can, for example, also comprise a phosphor in this case.

As a result of the embodiment of the carrier body 14 as a so-called chip carrier for the semiconductor component 7 with an integrated temperature sensor in the form of a thermistor sensor structure 3, firstly an accurate temperature measurement as described in association with FIG. 1 and also a compact design can thus be achieved. Moreover, an efficient heat dissipation from the semiconductor component 7 can be achieved as a result of the direct mounting of the carrier body 14 on the heat sink 1.

Figure 3:
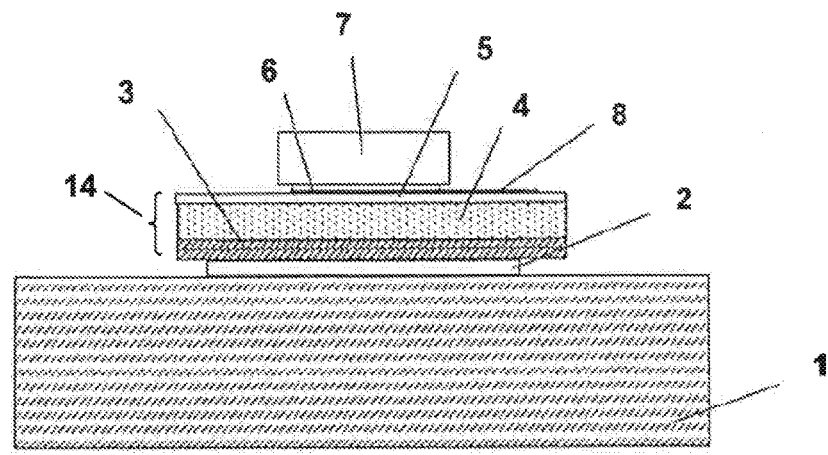
FIGS. 3 and 4 show a schematic illustration of a semiconductor device in accordance with a further exemplary embodiment.

FIG. 3 shows a further exemplary embodiment of a semiconductor device, in which, in comparison with the previous exemplary embodiment, the integrated thermistor sensor structure 3 is arranged on that side of the ceramic body 4 which faces away from the semiconductor component 7. As a result, it can be possible, for example, for the electrical contacting of the semiconductor component 7 and the thermistor sensor structure 3 to be formed on two different sides of the carrier body 14. By way of example, the thermistor sensor structure 3 can also be electrically contactable directly by means of the contact pad 2. The ceramic body 4 can be chosen with regard to its thickness and its material in particular in such a way that the carrier body 14 has the required mechanical stability and at the same time allows a high heat conduction from the semiconductor component 7 to the integrated thermistor sensor structure 3, in order to enable a temperature difference between the semiconductor component 7 and the thermistor sensor structure 3 of less than 3 K/W during operation. In particular the abovementioned materials for the ceramic body 4 are suitable for this purpose.

Figure 5:
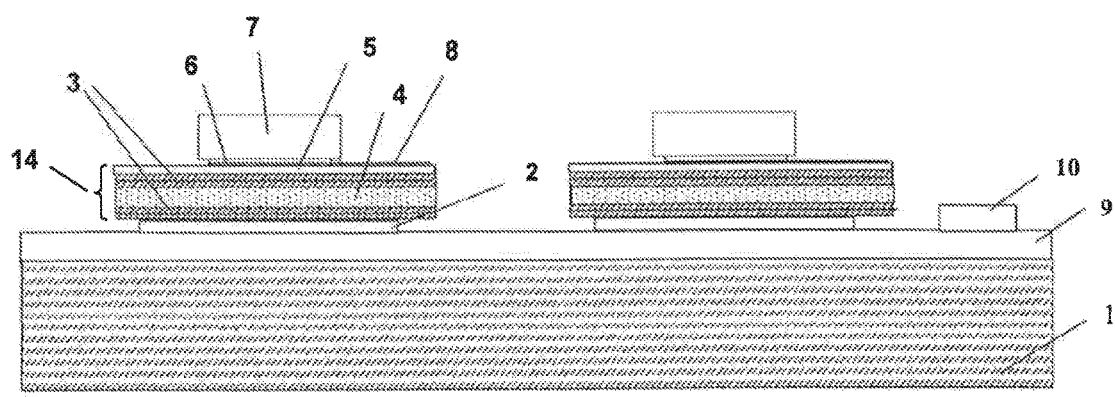
FIG. 5 shows a schematic illustration of a semiconductor device in accordance with a further exemplary embodiment.

Furthermore, as is also shown in association with FIG. 5, a combination of the exemplary embodiments from FIGS. 2 and 3 can also be possible, in which two thermistor sensor structures 3 are integrated into the carrier body 14, which are arranged on different sides of the ceramic body 4 and are in direct contact with the ceramic body 4.

Figure 4:
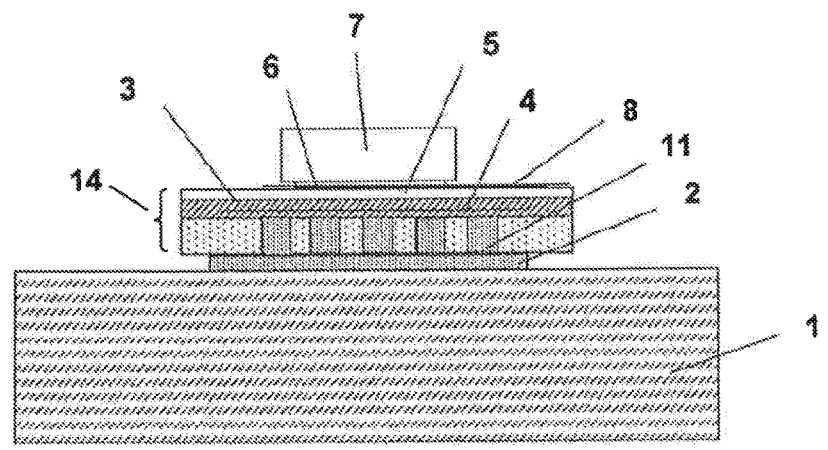

FIG. 4 shows a further exemplary embodiment of a semiconductor device, in which, in order to increase the heat conduction through the ceramic body 4, in the latter provision is made for thermal vias 11 which project through the ceramic body 4 and which are in thermal contact with the integrated thermistor sensor structure 3. The thermal vias 11 can be formed, for example, by metal-filled openings. Depending on the embodiment of the carrier body 14 and the thermistor sensor structure 3, insulator layers can be arranged between the thermal vias and the thermistor sensor structure 3 in order that the underside of the carrier body 14, as viewed from the heat sink 1, is electrically insulated from the thermistor sensor structure 3.

FIG. 5 shows a further exemplary embodiment, which exhibits a combination of the exemplary embodiments from FIGS. 2 and 3 with regard to the carrier bodies 14. Furthermore, the semiconductor device in FIG. 5, in comparison with the previous exemplary embodiments, comprises a plurality of carrier bodies 14 having in each case a semiconductor component 7 mounted thereon. In contrast to the illustration shown in FIG. 5, the carrier bodies 14 can also be embodied in accordance with the previous exemplary embodiments.

The semiconductor components 7 can be embodied identically or differently. By way of example, the plurality of semiconductor components 7 can be a plurality of LEDs, in particular high-power LEDs, such that the semiconductor device in accordance with the exemplary embodiment in FIG. 5 can be embodied as flashlight or a headlight module. Furthermore, the semiconductor components 7 on the different carrier bodies 14 can also be embodied differently and thus provide different functionalities for the semiconductor device.

In order to achieve an electrical insulation of the semiconductor components 7 and of the carrier bodies 14 in each case with respect to one another, the heat sink 1 comprises an insulator layer 9 on which the carrier bodies 14 are mounted by means of contact pads 2.

Furthermore, the semiconductor device comprises a discrete protective component 10 on the heat sink 1, that is to say an electrical component which is not integrated into the carrier bodies 14, but rather is mounted on the heat sink 1 separately from the carrier bodies. The protective component 10 can, for example, be embodied as an ESD protective component and form protection of the semiconductor device against electrostatic discharges.

In accordance with further exemplary embodiments, the exemplary embodiments shown in association with the figures can also be combined with one another, even if such feature combinations are not explicitly described. Furthermore, the exemplary embodiments shown in the figures can have further or alternative features in accordance with the description in the general part.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A semiconductor device comprising:
a semiconductor component;
a carrier body on which the semiconductor component is mounted, the carrier body comprising a ceramic body and thermistor sensor structures each directly connected to the ceramic body, the thermistor sensor structures being integrated into the carrier body; and
a heat sink, wherein the carrier body is mounted on the heat sink,
wherein the semiconductor device is configured to establish a heat dissipating path between the semiconductor component, the carrier body and the heat sink, wherein one of the thermistor sensor structures is arranged on a side of the carrier body facing the semiconductor component and another of the thermistor sensor structures is arranged on a side of the carrier body facing away from the semiconductor component.

2. The semiconductor device according to claim 1, wherein the ceramic body has an electrical resistivity of more than 50 000 ohm·cm.

3. The semiconductor device according to claim 1, wherein the thermistor sensor structures have an electrical resistivity of less than 5000 ohm·cm.

4. The semiconductor device according to claim 1, wherein the thermistor sensor structures comprise NTC thermistors.

5. The semiconductor device according to claim 1, wherein the heat sink comprises a metallic heat sink.

6. The semiconductor device according to claim 1, wherein the carrier body is mounted directly on the heat sink.

7. The semiconductor device according to claim 1, wherein the carrier body has a contact structure, the semiconductor component being mounted on the carrier body by way of the contact structure.

8. The semiconductor device according to claim 1, wherein the carrier body has a metal structure for redistribution wiring and for electrical connection of the semiconductor component.

9. The semiconductor device according to claim 1, wherein the carrier body has an insulator layer between the one thermistor sensor structure that faces the semiconductor component and the semiconductor component.

10. The semiconductor device according to claim 1, further comprising a plurality of carrier bodies and a plurality of semiconductor components, wherein the plurality of carrier bodies are mounted on the heat sink, and wherein each carrier body of the plurality of carrier bodies has a respective semiconductor component of the plurality of semiconductor components mounted thereon.

11. The semiconductor device according to claim 1, further comprising a discrete protective component disposed on the heat sink.

12. The semiconductor device according to claim 1, wherein the semiconductor component comprises a power semiconductor component.

13. The semiconductor device according to claim 1, wherein the semiconductor component comprises a component selected from the group consisting of a light-emitting diode, a graphics chip, an amplifier chip and a discrete power transistor.

14. The semiconductor device according to claim 1, wherein the ceramic body comprises aluminum oxide and/or aluminum nitride.

15. The semiconductor device according to claim 1, wherein the thermistor sensor structures comprise PTC thermistors.

16. A semiconductor device comprising:
a semiconductor component;
a carrier body on which the semiconductor component is mounted, the carrier body comprising a ceramic body and a thermistor sensor structure directly connected to the ceramic body, the thermistor sensor structure being integrated into the carrier body;

an insulating layer arranged between the thermistor sensor structure and the semiconductor component, the insulating layer being reflective; and a heat sink, wherein the carrier body is mounted on the heat sink.

17. The semiconductor device according to claim 16, wherein the insulating layer is white.

18. The semiconductor device according to claim 16, wherein the insulating layer comprises aluminum oxide, titanium oxide, silicon oxide or a plastic material.

19. The semiconductor device according to claim 16, wherein the carrier body has thermal vias that project through the ceramic body and are in thermal contact with the thermistor sensor structure.

\* \* \* \* \*